United States Patent
Shimada et al.

(10) Patent No.: US 7,471,077 B2
(45) Date of Patent: Dec. 30, 2008

(54) CONVEYOR DEVICE, ELECTRONIC DEVICE HANDLING APPARATUS AND CONVEYING METHOD IN ELECTRONIC DEVICE HANDLING APPARATUS

(75) Inventors: Kenichi Shimada, Tokyo (JP); Tadashi Kainuma, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/294,341

(22) Filed: Dec. 6, 2005

(65) Prior Publication Data
US 2006/0119347 A1  Jun. 8, 2006

Related U.S. Application Data

(63) Continuation of application No. PCT/JP2004/008010, filed on Jun. 2, 2004.

(30) Foreign Application Priority Data
Jun. 6, 2003  (WO) ................ PCT/JP03/07219

(51) Int. Cl.
  *G01R 31/28* (2006.01)
(52) U.S. Cl. ................................. 324/158.1
(58) Field of Classification Search .............. None
  See application file for complete search history.

(56) References Cited

U.S. PATENT DOCUMENTS

| 5,906,472 | A | 5/1999 | Nakamura | |
| 6,437,593 | B1 * | 8/2002 | Ito et al. | 324/765 |
| 6,445,203 | B1 * | 9/2002 | Yamashita et al. | 324/760 |
| 6,456,062 | B2 * | 9/2002 | Yamashita et al. | 324/158.1 |
| 6,522,125 | B2 * | 2/2003 | Sagawa | 324/158.1 |
| 6,590,383 | B2 * | 7/2003 | Yamashita et al. | 324/158.1 |
| 6,728,652 | B1 * | 4/2004 | Kobayashi | 702/117 |
| 6,900,459 | B2 * | 5/2005 | Farnworth et al. | 324/754 |
| 7,232,328 | B2 * | 6/2007 | Saito | 439/331 |
| 7,371,078 | B2 * | 5/2008 | Ito et al. | 439/73 |
| 7,400,161 | B2 * | 7/2008 | Saito | 324/765 |

FOREIGN PATENT DOCUMENTS

| JP | A-61-262816 | 11/1986 |
| JP | A-06-155356 | 6/1994 |
| JP | U-6-82853 | 11/1994 |
| JP | A-10-2931 | 1/1998 |
| JP | A-10-163700 | 6/1998 |
| JP | A-10-279015 | 10/1998 |
| JP | A-10-291645 | 11/1998 |
| JP | A-2003-117879 | 4/2003 |
| WO | WO2004109305 A1 * | 12/2004 |

OTHER PUBLICATIONS

International Search Report mailed on Sep. 21, 2004 for the International patent application No. PCT/JP2004/008010.

* cited by examiner

*Primary Examiner*—Jermele M Hollington
(74) *Attorney, Agent, or Firm*—Posz Law Group, PLC (57) ABSTRACT

A tray transfer arm 205 capable of holding and releasing a customer tray KST is movable in a Z-axis direction by a Z-axis drive, and the Z-axis drive is capable of switching a moving operation from a normal operation to a torque restriction operation while moving the tray transfer arm 205 downward in the Z-axis direction.

20 Claims, 12 Drawing Sheets

CONVEYOR DEVICE, ELECTRONIC DEVICE HANDLING APPARATUS AND CONVEYING METHOD IN ELECTRONIC DEVICE HANDLING APPARATUS

CROSS REFERENCE TO RELATED APPLICATIONS

The present application is a continuation of International Application No. PCT/JP2004/008010 filed on Jun. 2, 2004, which claims foreign priority to PCT/JP03/07219 filed on Jun. 6, 2003.

TECHNICAL FIELD

The present invention relates to an electronic device handling apparatus capable of handling electronic devices to be tested to conduct a test of the electronic devices, such as IC devices, a conveyor device used therein, and a conveying method in the electronic device handling apparatus, and particularly relates to a conveyor device, electronic device handling apparatus and conveying method, capable of surely holding and conveying a prescribed object by a simple configuration.

BACKGOUND ART

In a production procedure of an electronic device, such as an IC device, a testing apparatus for testing a finally produced electronic device becomes necessary. In such a testing apparatus, an electronic device handling apparatus called a handler handles a plurality of IC devices and brings the respective IC devices electrically contact with a test head, then, a test is conducted by a main testing device (tester).

In the handler, pre-test IC devices are stored in a stocker generally in a state of being held on a customer tray, reloaded from the customer tray to a test tray in a loader section, conveyed to the test head in a state of loaded on the test tray and tested. Post-test IC devices are conveyed from the test head, then, reloaded from the test tray to prescribed customer trays in accordance with the test results in an unloader section, and classified to categories, such as good ones and defective ones, and stored in a stocker.

Figure 12:
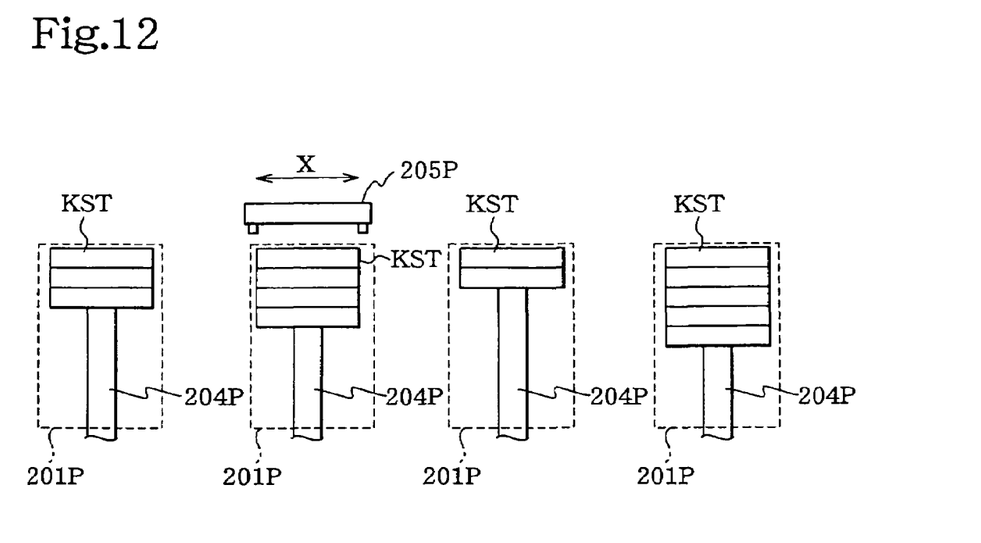
FIG. 12 is a schematic view of an IC storing section of a handler of the related art.

As shown in FIG. 12, normally, a plurality of stockers 201P are provided in the handler, each loaded with a plurality of customer trays KST. Note that the number of the loaded customer trays KST is not determined and varies in accordance with a condition. The customer tray KST is held and conveyed by a tray transfer arm 205P, given to a tray set elevator, then, conveyed to the loader section by the tray set elevator moving upward.

In a handler of the related art, the tray transfer arm 205P is not provided with a drive means for moving largely in the Z-axis direction, while each of the stockers 201P has an elevator 204P capable of moving the customer tray KST up and down and a sensor at a position where the customer tray KST is held by the tray transfer arm 205P. Each stocker 201P elevates the customer tray KST by the elevator 204P and adjusts a height of the uppermost customer tray KST by sensing the uppermost customer tray KST by the sensor.

In the above configuration, however, each stocker 201P needs the elevator 204P and the sensor, so that the configuration of the handler has become complicated.

Figure 13:
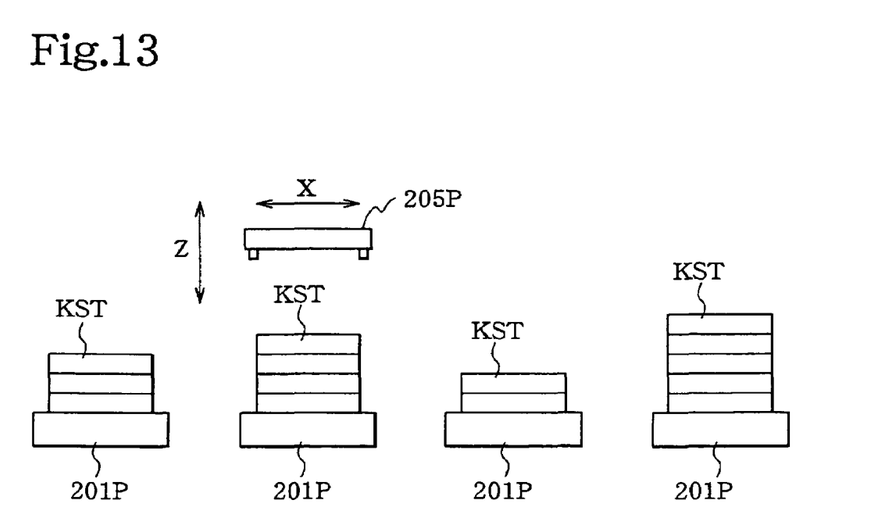
FIG. 13 is a schematic view showing a modified example of an IC storing section of a handler of the related art.

Thus, as shown in FIG. 13, omitting of the elevator from each stocker 201P and providing of a drive means for moving largely in the Z-axis direction to the tray transfer arm 205P are considered. In this case, to determine a moving amount of the tray transfer arm 205P downward in the Z-axis direction, the number (height) of customer trays KST loaded on each stocker 201P has to be perceived.

To perceive the number (height) of loaded customer trays KST, (1) a method of inputting the number of customer trays KST on each stocker 201P manually, (2) a method of setting a sensor to each stocker 201P, (3) a method of providing a movable sensor to a predetermined stocker 201P, and (4) a method of providing a sensor to the tray transfer arm 205P may be mentioned.

However, the method (1) has a disadvantage that the task is troublesome and possibility of erroneous inputting is high. Also, the method (2) cannot reduce the number of sensors comparing with that in the related art, and the method (3) takes time for the sensor to move to a predetermined stocker 201P. Furthermore, in the method (4), the tray transfer arm 205P has to receive a sensor signal while moving, so that it is difficult to perceive the height of the customer trays KST accurately due to an effect of receiving time of the sensor signal; and the tray transfer arm 205P may not be able to reach the customer tray KST or the tray transfer arm 205P may collide with the customer tray KST to damage the both depending on circumstances.

The above are disadvantages in conveying the customer trays KST carrying pre-test IC devices, but the same troubles may arise also in the case of storing the customer trays KST carrying post-test devices in a predetermined stocker.

DISCLOSURE OF THE INVENTION

The present invention was made in consideration of the above circumstances and has as an object thereof to provide a conveyor device, an electronic device handling apparatus and the conveying method, by which a prescribed object can be surely held and conveyed in a short operation time with a simple configuration and it is not necessary to perceive a height of the object or a loaded height of the object accurately.

To attain the above object, according to the first aspect of the present invention, there is provided a conveyor device capable of holding a prescribed object and moving at least in a Z-axis direction in an electronic device handling apparatus, comprising a holding device capable of holding and releasing the prescribed object; and a Z-axis drive capable of moving the holding device in the Z-axis direction and switching the moving operation from a normal operation to a torque restriction operation while moving the holding device downward in the Z-axis direction (the invention 1).

Note that "normal operation" in the present specification indicates an operation without a torque restriction and an operation capable of attaining moving at a higher speed comparing with that in the case of a torque restriction operation. Also, "torque restriction operation" in this specification indicates an operation under setting of stopping movement by applying predetermined torque and the moving speed generally becomes lower than that in a normal operation.

In the above invention (the invention 1), since the holding device itself is movable in the Z-axis direction, even when objects are at a plurality of positions, it is not necessary to provide the Z-axis drive to each of the positions. Also, a moving operation of the holding device can be changed from a normal operation to a torque restriction operation, so that by switching to a torque restriction operation before the holding device reaches the object and bringing the holding device contact with the object to be held or bringing the object held by the holding device contact with the loading portion under a torque restriction, it is not necessary to accurately perceive a height of the object or a loaded height of the object, it is possible to prevent the holding device from not reaching to the object or colliding with the object and, furthermore, a moving speed of the holding device at a position not requiring any torque restriction can be maintained high. Therefore, according to the above invention (the invention 1), it is possible to hold and convey an object surely in a short operation time with a simple configuration.

In the above invention (the invention 1), preferably, the Z-axis drive switches from a normal operation to a torque restriction operation when a distance between the holding device and an object to be held or a loading portion of the object becomes a predetermined distance (including the case where the holding device comes to a predetermined position or lower) (the invention 2).

In the above invention (the invention 2), preferably, a sensor capable of sensing that a distance between the holding device and an object to be held or a loading portion of the object is a predetermined distance is furthermore provided (the invention 3). As explained above, since the moving operation of the holding device can be switched from a normal operation to a torque restriction operation, it is not necessary to accurately perceive a height of the object or a loaded height of the object, so that the sensor is not required to be a highly accurate sensor.

In the above inventions (the inventions 1 to 3), preferably, when a predetermined torque is applied to the Z-axis drive, the Z-axis drive stops moving of the holding device and the holding device holds or releases a prescribed object (the invention 4).

Note that the present invention is not limited to the above and, for example, moving of the holding device may be stopped or the object may be held or released by sensing that the holding device or the object to be held contacts a prescribed object.

In the above invention (the invention 4), preferably, as a result that the holding device contacts an object to be held or that the object held by the holding device contacts a loading portion of the object, the torque is applied to the Z-axis drive (the invention 5).

In the above invention (the invention 5), it is possible to hold or release the object in a state of pressing the holding device against the object to be held or pressing the object to be held against the loading portion, so that the holding and releasing of the object can be performed stably comparing with the case of determining a height of the object or a loaded height of the object, moving the holding device to the height and holding or releasing the object.

In the above inventions (the inventions 1 to 5), preferably, the holding device is a device which can hold and release a tray capable of being loaded with a plurality of electronic devices (the invention 6).

In the above invention (the invention 6), preferably, the holding device comprises a tab member capable of engaging with the tray, the tab member is movable around the Z-axis, and the tray can be held or released by rotating the tab member around the Z-axis (the invention 7).

In the above inventions (the inventions 1 to 5), preferably, the holding device holds one or both of a first tray capable of being loaded with a plurality of electronic devices and a second tray for covering the electronic devices loaded on the first tray and moves (the invention 8).

In the above invention (the invention 8), preferably, the holding device comprises a holding/releasing mechanism capable of holding or releasing the tray and holding the trays in a state of two levels at a plurality of positions at the edge of the tray (the invention 9).

In the above inventions (the inventions 8 and 9), it is possible to prevent electronic devices loaded on the first tray from jumping out of the first tray due to the second tray.

According to the second aspect of the present invention, there is provided an electronic device handling apparatus capable of handling an electronic device to be tested to conduct a test on the electronic device, comprising the above conveying device (the inventions 1 to 9) (the invention 10).

According to the third aspect of the present invention, there is provided conveying method for conveying a prescribed object in an electronic device handling apparatus comprising a holding device capable of holding and releasing the object and a Z-axis drive capable of moving the holding device in the Z-axis direction, comprising steps of moving the holding device downward in the Z-axis direction by the Z-axis drive in a normal operation; sensing that a distance of the holding device and an object to be held or a loading portion of the object is a predetermined distance; and switching an operation of the Z-axis drive from the normal operation to a torque restriction operation based on the sensing (the invention 11).

In the above invention (the invention 11), preferably, it is sensed that a torque is applied to the Z-axis drive as a result that the holding device contacts an object to be held or that the object held by the holding device contacts a loading portion of the object; and an operation of the Z-axis drive is stopped and the holding device is made to perform an object holding operation or an object releasing operation based on the sensing (the invention 12).

BEST MODE FOR CARRYING OUT THE INVENTION

Below, an embodiment of the present invention will be explained based on the drawings.

Figure 1:
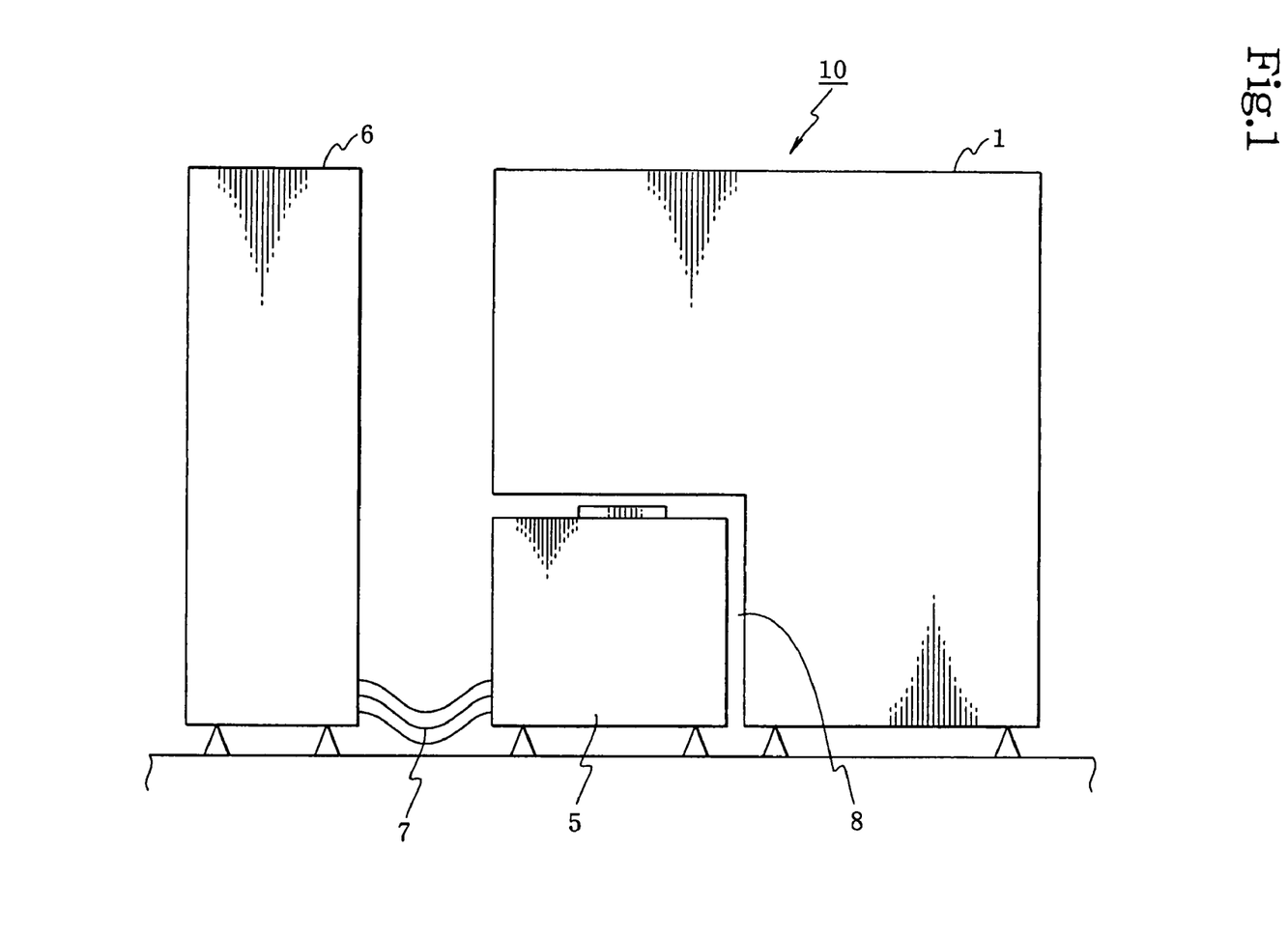
FIG. 1 is an overall view form the side of an IC device testing apparatus including a handler according to an embodiment of the present invention.

First, an overall configuration of an IC device testing apparatus provided with an electronic device handling apparatus (hereinafter, referred to as "a handler") according to the present embodiment will be explained. As shown in FIG. 1, an IC device testing apparatus 10 comprises a handler 1, a test head 5 and a main testing device 6. The handler 1 performs an operation of successively conveying IC devices (an example of electronic devices) to be tested to sockets provided on the test head 5, classifying IC devices finished with the test in accordance with the test results and storing in predetermined trays.

The sockets provided on the test head 5 are electrically connected to the main testing device 6 through a cable 7, connects IC devices attached detachably on the sockets to the main testing device 6 through the cable 7 and conducts a test on the IC devices by a test electric signal from the main testing device 6.

In the lower portion of the handler 1, a control device for mainly controlling the handler 1 is incorporated and a space 8 is provided to a part thereof. The test head 5 is placed in a freely replaceable way in the space 8, and IC devices can be attached on the sockets on the test head 5 through a through hole formed on the handler 1.

Figure 2:
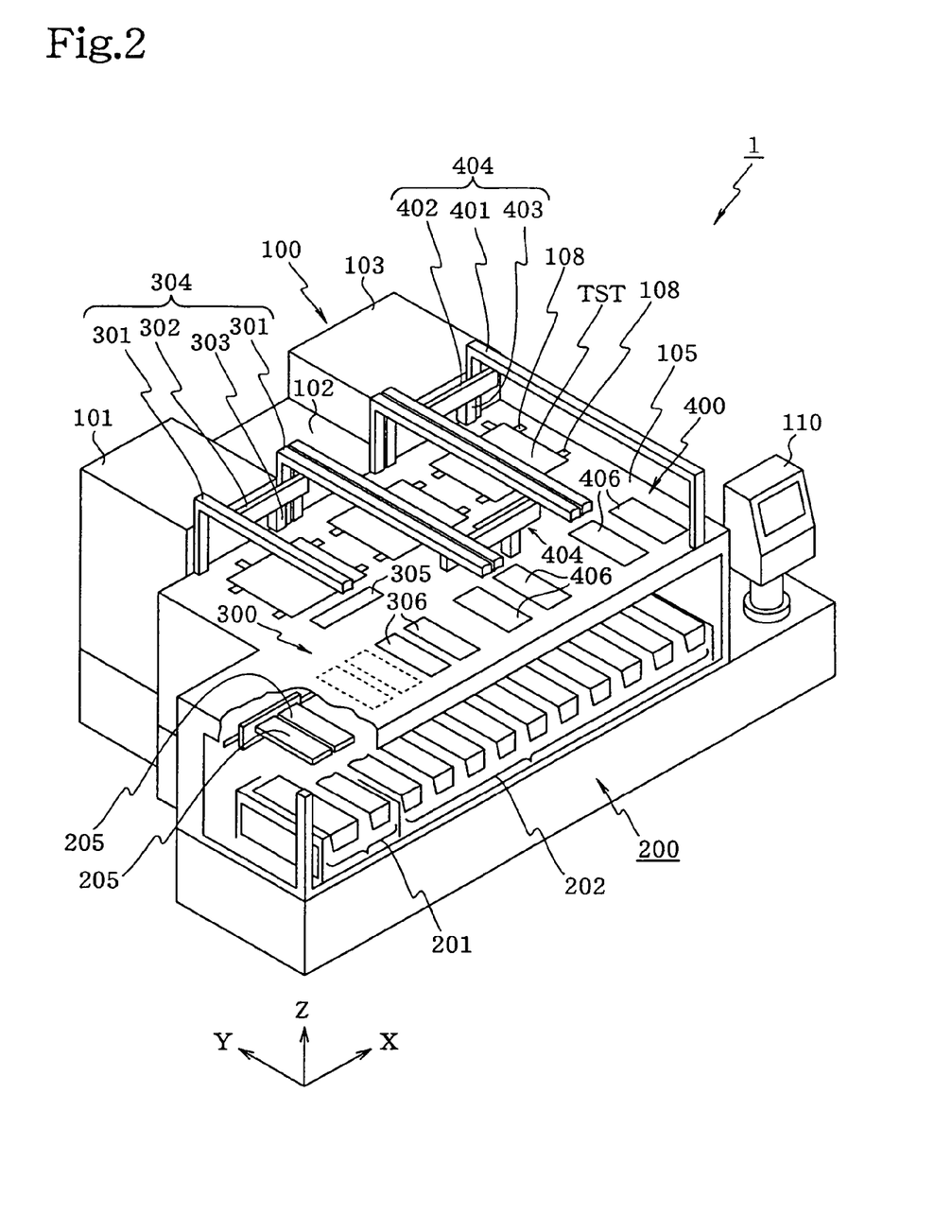
FIG. 2 is a perspective view of the handler shown in FIG. 1.
Figure 3:
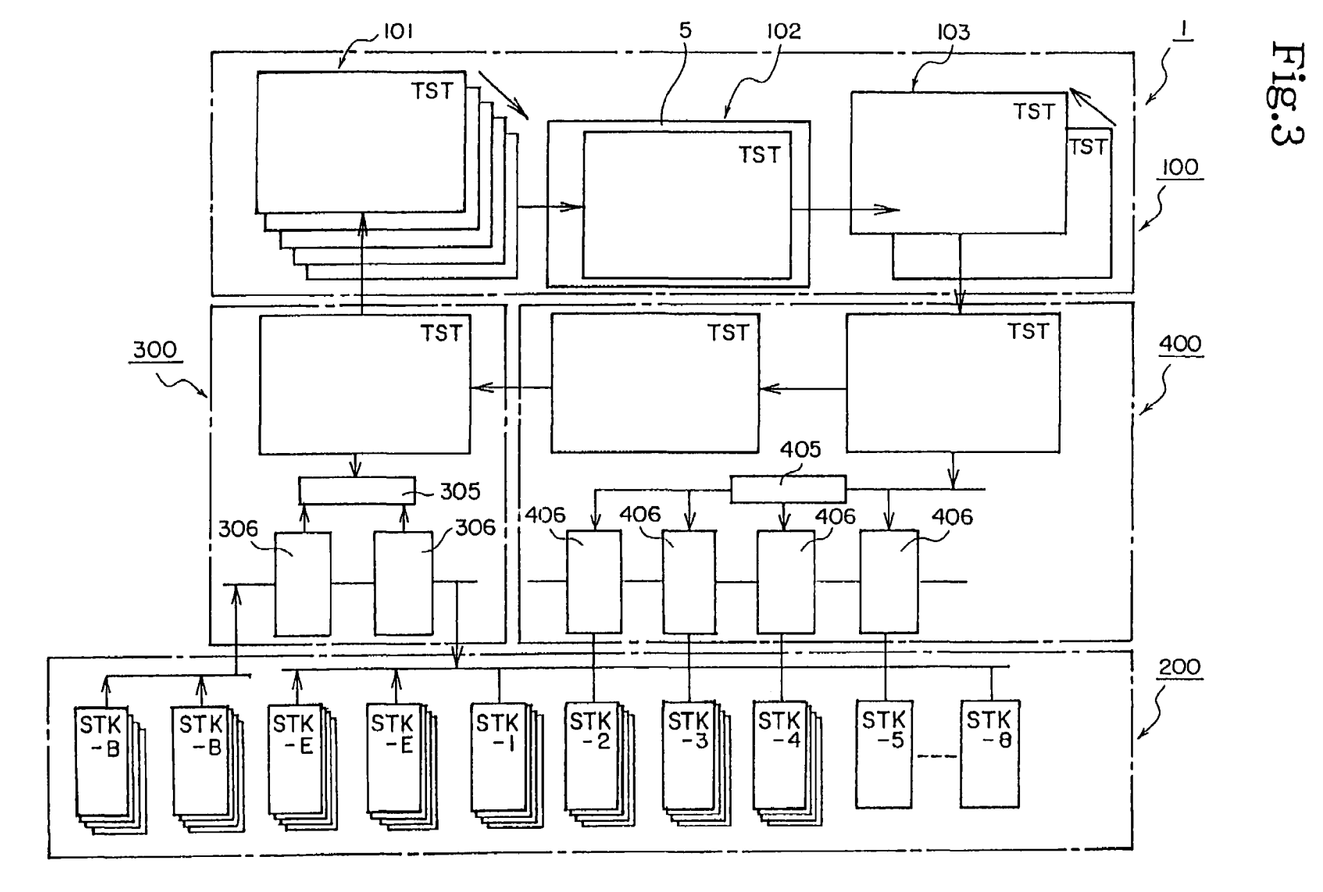
FIG. 3 is a flowchart of trays showing a handling method of IC devices to be tested.

The handler 1 is an apparatus for conducting a test on IC devices as electronic devices to be tested at a normal temperature, in a higher temperature state (high temperature) than the normal temperature, or in a lower temperature state (low temperature) than the normal temperature. The handler 1 comprises, as shown in FIG. 2 and FIG. 3, a chamber 100 composed of a constant temperature chamber 101, a test chamber 102 and an unsoak chamber 103. An upper portion of the test head 5 shown in FIG. 1 is inserted to inside of the test chamber 102, where IC devices 2 are tested.

Note that FIG. 3 is a view for understanding a handling method of IC devices to be tested in the handler of the present embodiment and partially shows by a plan view members actually arranged aligned in the vertical direction. Therefore, the mechanical (three-dimensional) structure can be understood mainly by referring to FIG. 2.

As shown in FIG. 2 and FIG. 3, the handler 1 of the present embodiment comprises an IC storing section 200 for storing IC devices yet to be tested and storing post-test IC devices by classifying them, a loader section 300 for conveying IC devices to be tested sent from the IC storing section 200 to the chamber 100, a chamber section 100 including the test head, and an unloader section 400 for taking out and classifying post-test IC devices finished with a test in the chamber section 100. Inside the handler 1, IC devices are held on a test tray TST and conveyed in the handler 1.

Figure 5:
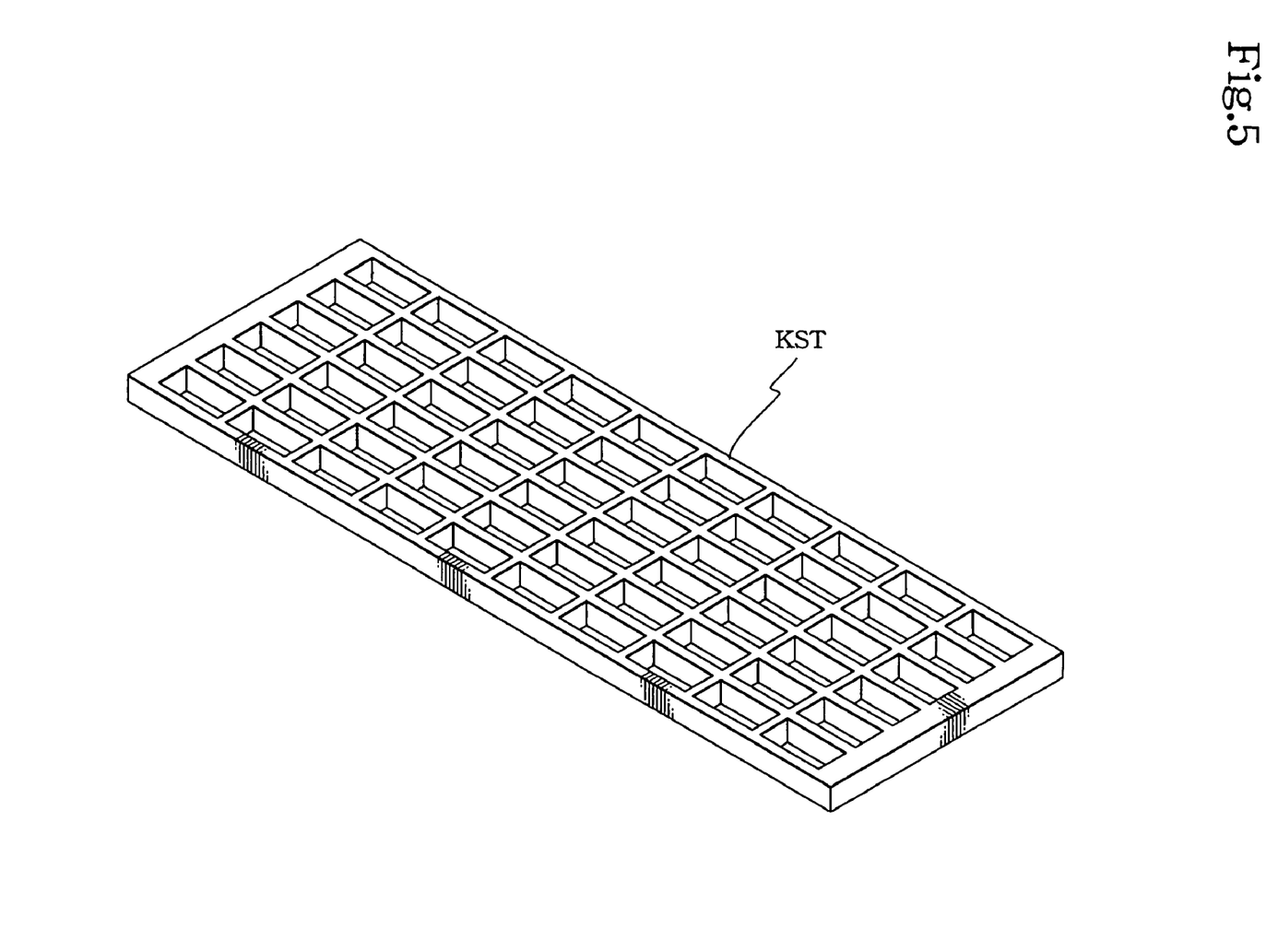
FIG. 5 is a perspective view of a customer tray used in the handler.

A large number of the IC devices are held on the customer tray KST shown in FIG. 5 before being set in the handler 1, supplied in that state to the IC storing section 200 of the handler 1 shown in FIG. 2 and FIG. 3, where the IC devices are reloaded from the customer tray KST to the test tray TST to be conveyed in the handler 1. Inside the handler 1, as shown in FIG. 3, the IC devices are moved in a state of being loaded on the test tray TST, given a thermal stress of a high temperature or a low temperature for testing (inspecting) whether or not they operate appropriately and classified in accordance with the test results.

Here, parts relating to the IC storing section 200, the loader section 300 and the unloader section 400 will be explained.

As shown in FIG. 2, the IC storing section 200 is provided with a pre-test IC stocker 201 for storing IC devices before tested and a post-test IC stocker 202 for storing IC devices classified in accordance with the test results.

Figure 4:
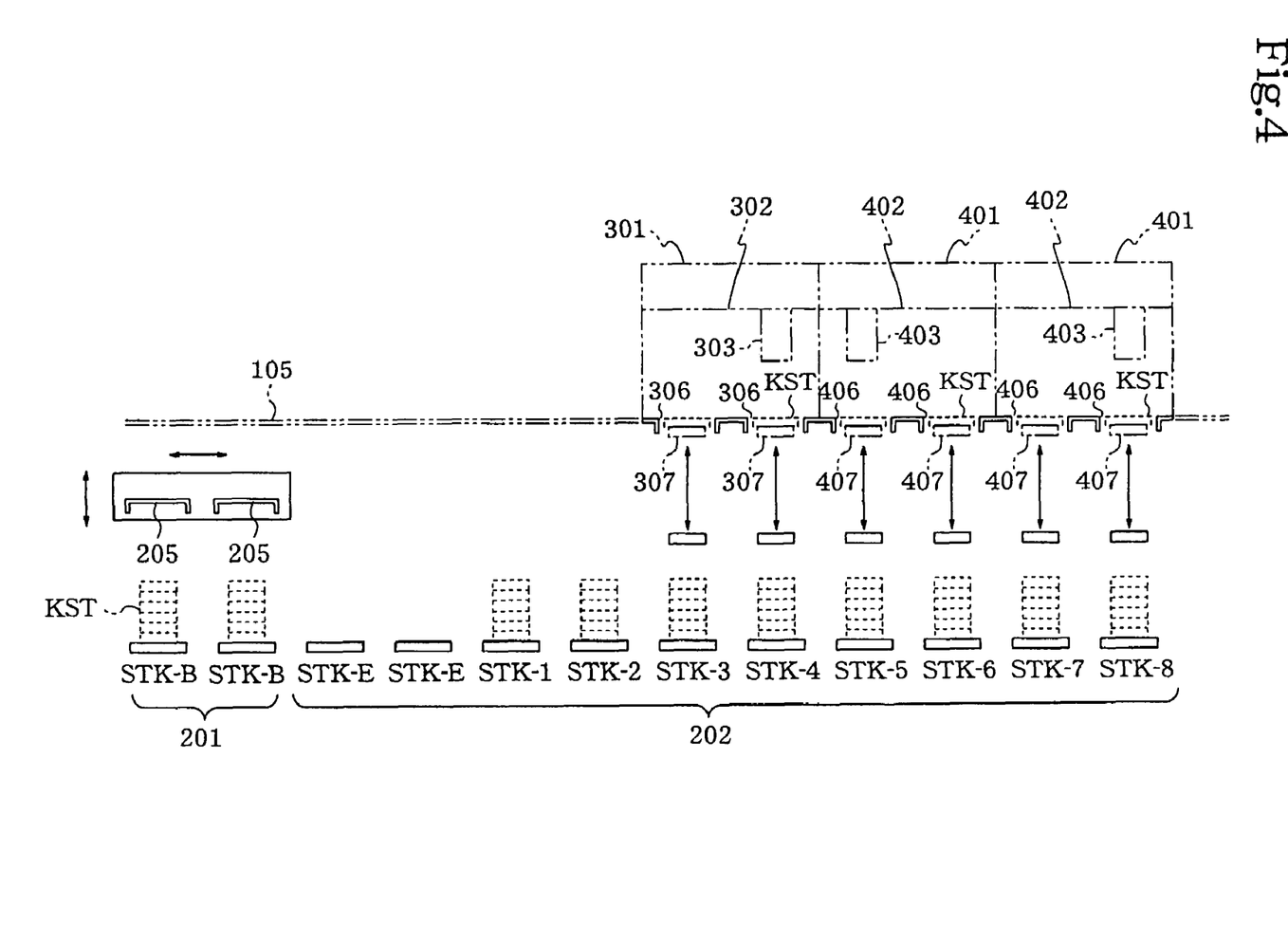
FIG. 4 is a schematic view of an IC storing section of the handler.

As shown in FIG. 4, the pre-test IC stocker 201 holds stacked customer trays KST on which the IC devices to be tested are held, while the post-test IC stocker 202 holds stacked customer trays KST on which IC devices finished being tested are classified. Note that the customer tray KST in the present embodiment has IC device holding portions by 10 lines×6 rows, but the present invention is not limited to that.

As shown in FIG. 2 to FIG. 4, in the present embodiment, two stockers STK-B are provided as the pre-test IC stockers 201. Next to the stockers STK-B, two empty stockers STK-E to be sent to the unloader section 400 are provided as the post-test IC stockers 202. Furthermore, next to that, eight stockers SKT-1, SKT-2, ..., SKT-8 are provided as the post-test stockers 202 and configured to be able to hold IC devices sorted into a maximum of eight classes according to the test results. That is, in addition to classifying IC devices as good and defective, it is possible to divide the good IC devices into ones with high operating speeds, ones with medium speeds, and ones with low speeds and the defective IC devices into ones requiring retesting, etc.

On the other hand, as shown in FIG. 2, on an apparatus substrate 105 of the loader section 300, three pairs of windows 306 are formed in an arrangement, by which the customer tray KST faces to an upper face of the apparatus substrate 105. As shown in FIG. 4, a tray set elevator 307 for lifting and lowering the customer tray KST is provided below each of the windows 306. Also, as shown in FIG. 2 and FIG. 4, tray transfer arms 205 are provided between the IC storing section 200 and the apparatus substrate 105.

Each of the tray transfer arm 205 is movable in the Z-axis direction and X-axis direction, moves from an origin downward in the Z-axis direction to hold a customer tray KST loaded on the pre-test IC stocker 201, moves upward in the Z-axis direction to return to the origin, then, moves in the X-axis direction to give the customer tray KST to a prescribed tray set elevator 307. The tray set elevator 307 lifts the received customer tray KST to make it expose to the window 306 of the loader section 300.

Then, in the loader section 300, IC devices to be tested loaded on the customer tray KST are temporarily transferred by an X-Y conveyor device 304 to precisers 305, where mutual positions of the IC devices are corrected. After that, the IC devices transferred to the precisers 305 were furthermore reloaded to a test tray TST rested at the loader section 300 by again using the X-Y conveyor device 304.

The X-Y conveyor 304 for reloading IC devices to be tested from a customer tray KST to a test tray TST comprises, as shown in FIG. 2, two rails 301 laid over the apparatus substrate 105, a movable arm 302 capable of moving back and forth (this direction designated as the Y-direction) between the test tray TST and the customer tray KST by the two rails 301, and a movable head 303 supported by the movable arm 302 and capable of moving in the X-axis direction along the movable arm 302.

The movable head 303 of the X-Y conveyor 304 has suction pads attached facing downward. The suction pads move while drawing air to pick up the IC devices to be tested from the customer tray KST and reload the IC devices to be tested on the test tray TST. For example, about eight suction pads as above are provided for the movable head 303, so it is possible to reload eight IC devices to be tested at a time on the test tray TST.

The unloader section 400 shown in FIG. 2 and FIG. 3 is also provided with X-Y conveyor devices 404 and 404 having the same configuration as that of the X-Y conveyor device 304 provided to the loader section 300, and the X-Y conveyor devices 404 and 404 reload post-test IC devices from the test tray TST conveyed to the unloader section 400 to the customer tray KST.

As shown in FIG. 2, on the apparatus substrate 105 in the unloader section 400, two pairs of windows 406 are formed in an arrangement, by which the customer tray KST conveyed to the unloader section 400 faces to the upper surface of the apparatus substrate 105. As shown in FIG. 4, a tray set elevator 407 for lifting and lowering a customer tray KST is provided below each of the windows 406.

The tray set elevator 407 is loaded with a customer tray KST becoming full (full tray) after being reloaded with the post-test IC devices and moves downward. The tray transfer arms 205 shown in FIG. 2 and FIG. 4 receive the full tray from the lowered tray set elevator 407, moves in the X-axis direction to above a prescribed post-test IC stocker 202, then, moves downward in the Z-axis direction to load the full tray on the post-test IC stocker 202 and moves upward in the Z-axis direction to return to the origin. In this way, the full tray is stored in the post-test IC stocker 202.

As shown in FIG. 2 and FIG. 4, in the present embodiment, two tray transfer arms 205 are provided in parallel in the X-axis direction. Each of the tray transfer arms 205 is independently movable in the Z-axis direction, but they move in a state of being alongside in the X-axis direction.

Figure 6:
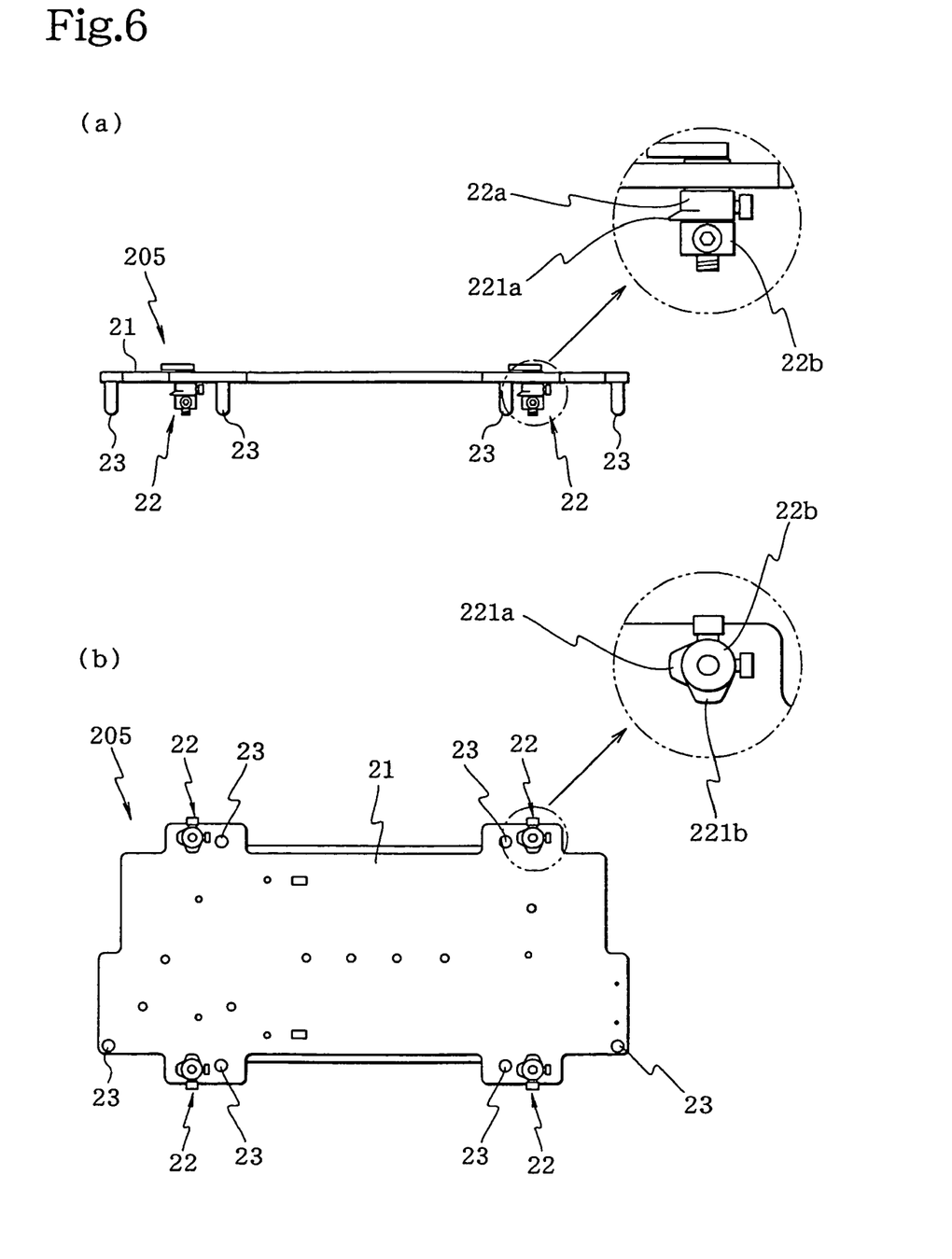
FIG. 6 shows a front view (a) and a bottom view (b) of a tray transfer arm in the same handler.

As shown in FIGS. 6(a) and (b), the tray transfer arm 205 comprises an arm substrate 21 having a size of covering the customer tray KST, tab members 22 provided to approximate four corners on a lower side of the arm substrate 21, and six guide pins 23 provided at the rim on the lower side of the arm substrate 21.

The tab member 22 has two levels: an upper level tab member 22a and a lower level tab member 22b. The tab members 22a and 22b are rotatable around the Z-axis and have tabs 221a and 221b respectively at a part in their circumferential direction. Note that the tab 221a of the upper level tab member 22a and the tab 221b of the lower level tab member 22b are provided to be shifted by 90 degrees in their circumferential direction.

As a result that the tab members 22a and 22b rotate in the closing direction around the Z-axis, the tabs 221a and 221b engage with the rim of the customer tray KST so as to be able to hold the customer tray KST; while by rotating in the opening direction around the Z-axis, the tabs 221a and 221b engaged with the rim of the customer tray KST are unlatched from the rim of the customer tray KST so as to be able to release the customer tray.

Figure 7:
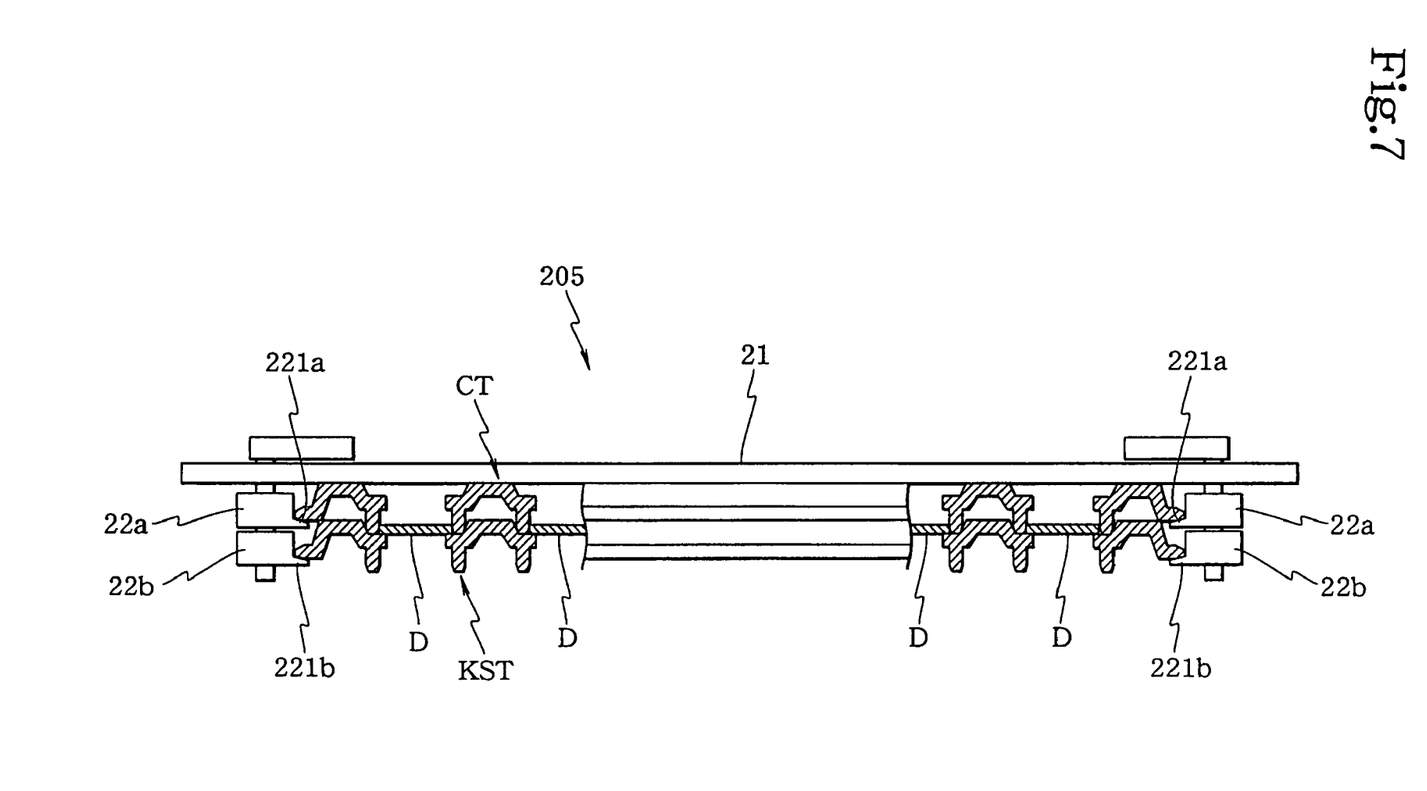
FIG. 7 is a front view showing a state that the tray transfer arm shown in FIG. 6 holds a cover tray and a customer tray.

As shown in FIG. 7, the upper level tab member 22a is for holding a cover tray CT, and the lower level tab member 22b is for holding a customer tray KST loaded with IC devices D. Note that the cover tray CT in the present embodiment is a customer tray KST not loaded with IC devices D and used by being superimposed over a customer tray KST loaded with IC devices D, so that the IC devices. D do not jump out of the customer tray KST when conveying the customer tray loaded with the IC devices D.

The tray transfer arm 205 is movable in the X-axis direction and Z-axis direction by a not shown X-axis drive and Z-axis drive. The Z-axis drive is capable of switching a moving operation from a normal operation to a torque restriction operation when moving the tray transfer arm 205 downward in the Z-axis direction. For example, a device using an electronically controllable servo mortar, etc. may be used as the Z-axis drive.

Here, sensors relating to the tray transfer arm 205, stockers 201 and 202 and the tray set elevators 307 and 407 will be explained with reference to FIG. 8.

Figure 8:
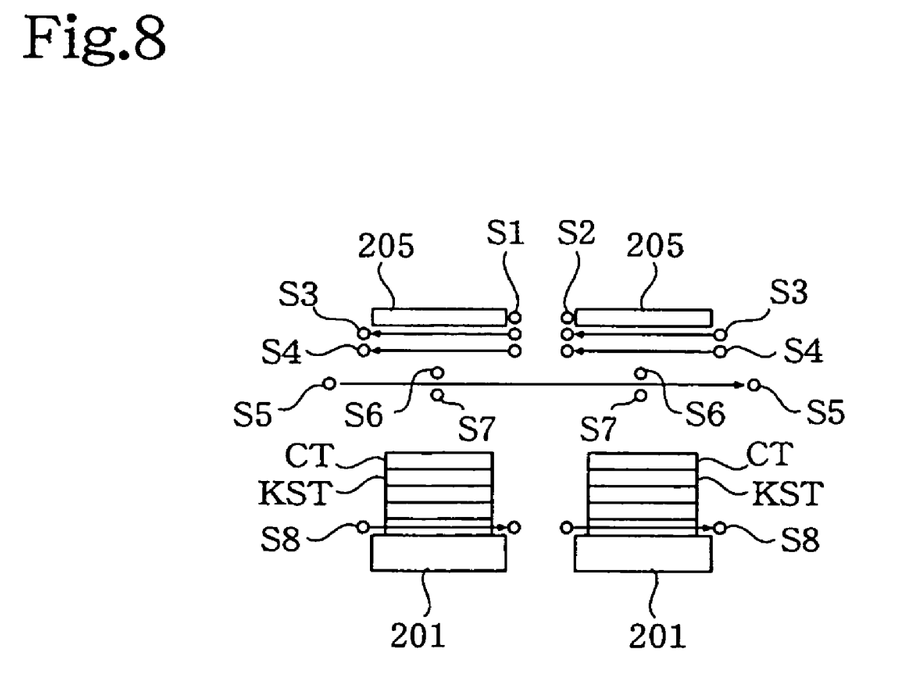
FIG. 8 is a schematic view of the tray transfer arm and customer trays loaded on a stocker in the handler.

As shown in FIG. 8, at a position adjacent to a side portion of each tray transfer arm 205 in a state of positioning of the tray transfer arm 205 at the upper limit (origin) in the Z-axis direction, an origin sensor S1 for sensing that the tray transfer arm 205 (on the left side) is at the origin and an origin sensor S2 for sensing that the tray transfer arm 205 (on the right side) is at the origin are provided.

At the upper level of the tray holding portion (a position surrounded by the upper level tab member 22a) of each tray transfer arm 205, a cover tray check sensor S3 for sensing that the cover tray CT is at the upper level of the tray holding portion is provided; and at a lower level of the tray holding portion (a position surrounded by the lower level tab member 22b) of each tray transfer arm 205, a customer tray check sensor S4 for sensing that a customer tray KST is at the lower level of the tray holding portion is provided.

Between the tray transfer arm 205 positioned at the origin and stockers 201 and 202 is provided with a stocker upper limit sensor S5 for sensing that customer trays KST loaded on the stockers 201 and 202 reach the upper limit. When the stocker upper limit sensor S5 senses that the customer trays KST loaded on the stockers 201 and 202 have reached the upper limit, downward movement of the tray transfer arm 205 in the Z-axis direction is locked to prevent collision of the tray transfer arm 205 with the customer trays KST.

At a predetermined position below the tray transfer arm 205, a distance confirmation sensor S6 moving in the Z-axis direction along with the tray transfer arm 205 is provided. The distance confirmation sensor S6 senses an object (a customer tray KST, tray set elevators 307 and 407, etc.) at a predetermined position below the tray transfer arm 205 and confirm that the tray transfer arm 205 and the object are at a predetermined distance. If the distance confirmation sensor S6 reacts when the tray transfer arm 205 moves downward in the Z-axis direction, the moving operation (a drive condition of the Z-axis drive) of the tray transfer arm 205 is switched from a normal operation to a torque restriction operation.

At a predetermined position below the tray transfer arm 205 and below the distance confirmation sensor S6, a stocker full sensor S7 movable in the Z-axis direction along with the tray transfer arm 205 is provided. The stocker full sensor S7 senses that the stockers 201 and 202 become full with customer trays KST.

At the lowermost level of the stockers 201 and 202, a stocker tray sensor S8 for sensing that a customer tray KST is loaded on the stockers 201 and 202 is provided.

Kinds of the sensors S1 to S8 above are not particularly limited and, for example, reflection type or transmission type optical sensor, etc. may be suitably used.

Next, an operation of the tray transfer arm 205 when transferring a customer tray KST loaded with pre-test IC devices from the pre-test IC stocker 201 to the tray set elevator 307 in the above handler 1 will be explained with reference to FIG. 9 and FIG. 10. Note that only an operation of the tray transfer arm 205 on the left side will be explained here.

Figure 9:
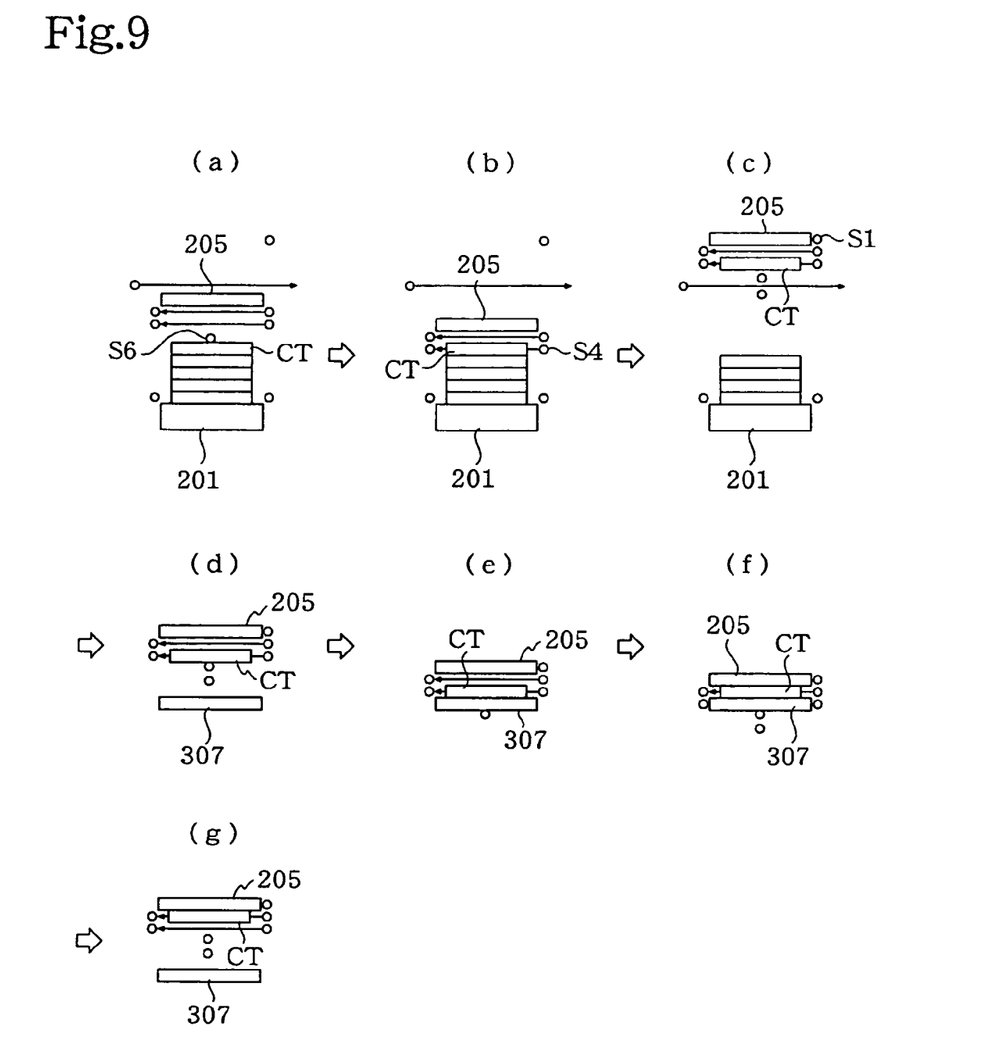
FIG. 9 shows explanatory views of steps that the tray transfer arm holds a cover tray.

The tray transfer arm 205 has to hold the cover tray CT in advance when holding a customer tray KST loaded with IC devices, therefore, an operation of holding the cover tray CT by the tray transfer arm 205 will be explained first (FIG. 9). Note that it is assumed that the cover tray CT positions at the uppermost level of customer trays KST loaded on the pre-test IC stocker 201.

The tray transfer arm 205 moves downward in the Z-axis direction from a position (origin) shown in FIG. 8 on the pre-test IC stocker 201 in the normal operation. As shown in FIG. 9(a), the distance confirmation sensor S6 moves downward to a position of the cover tray CT as the tray transfer arm 205 moves and, when the distance confirmation sensor S6 senses an existence of the cover tray CT, a moving operation of the tray transfer arm 205 is switched to the torque restriction operation.

The tray transfer arm 205 moves downward in the Z-axis direction in the torque restriction operation and, as shown in FIG. 9(*b*), when a customer tray check sensor S4 provided to the tray transfer arm 205 senses the cover tray CT, the moving operation of the tray transfer arm 205 stops, the tab member 22 rotates in the closing direction, and the tab 221*b* of the tab member 22*b* engages with the rim of the cover tray CT so as to hold the cover tray CT.

The tray transfer arm 205 moves upward in the Z-axis direction in a state of holding the cover tray CT at the lower level of the tray holding portion in the normal operation and returns to the origin. Next, as shown in FIG. 9(*d*), after moving in the X-axis direction to position above a tray set elevator 307, the tray transfer arm 205 moves downward in the Z-axis direction in the torque restriction operation.

As shown in FIG. 9(*e*), when the cover tray CT held by the tray transfer arm 205 contacts the tray set elevator 307, a torque is applied to the Z-axis drive, the moving operation of the tray transfer arm 205 temporarily stops based on the torque application, and the tab member 22 rotates in the opening direction, so that the cover tray CT can position at the upper level of the tray holding portion of the tray transfer arm 205. Next, as shown in FIG. 9(*f*), the tray transfer arm 205 moves downward by one level, the tab member 22 rotates in that state in the closing direction, and the tab 221*a* of the tab member 22*a* engages with the rim of the cover tray CT to hold the cover tray CT.

The tray transfer arm 205 moves upward in the Z-axis direction in a state of holding the cover tray CT at the upper level of the tray holding portion in the normal operation and returns to the origin as shown in FIG. 9(*g*).

Figure 10:
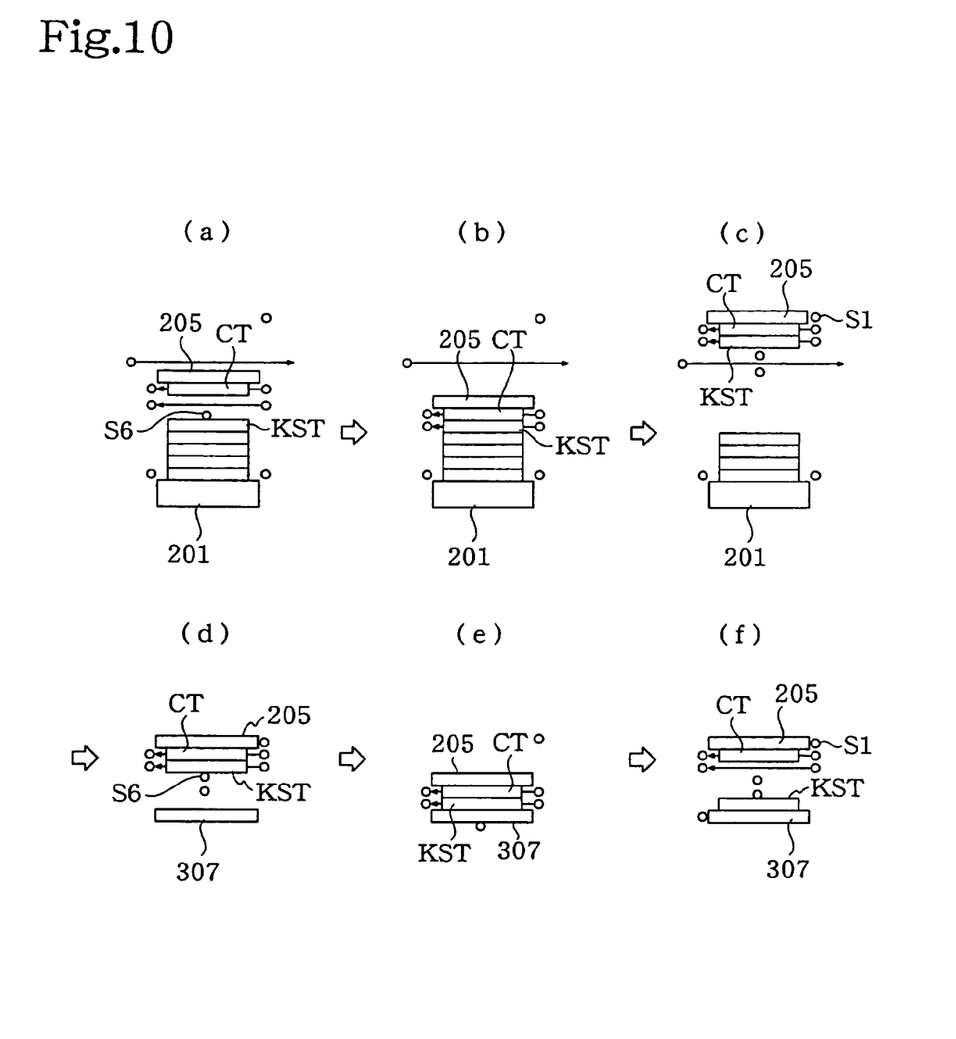
FIG. 10 shows explanatory views showing steps that the tray transfer arm conveys customer trays from a pre-test IC stocker to a tray set elevator.

Next, an operation that the tray transfer arm 205 holding the cover tray CT conveys the customer trays KST from the pre-test IC stocker 201 to the tray set elevator 307 will be explained (FIG. 10).

The tray transfer arm 205 holding the cover tray CT moves downward in the Z-axis direction from the position (origin) shown in FIG. 8 on the pre-test stocker 201 in the normal operation. As shown in FIG. 10(*a*), the distance confirmation sensor S6 moves downward to a position of the cover tray CT as the tray transfer arm 205 moves and, when the distance confirmation sensor S6 senses an existence of the customer tray KST, the moving operation of the tray transfer arm 205 is switched to the torque restriction operation.

The tray transfer arm 205 moves downward in the Z-axis direction in the torque restriction operation and, as shown in FIG. 10(*b*), when the cover tray CT held by the tray transfer arm 205 contacts the customer tray KST, a torque is applied to the Z-axis drive, the moving operation of the tray transfer arm 205 stops based on the torque application, the tab member 22 rotates in the closing direction, and the tab 221*b* of the tab member 22*b* engages with the rim of the customer tray KST to hold the customer tray KST (refer to FIG. 7).

The tray transfer arm 205 moves upward in the Z-axis direction in a state of holding the customer tray KST at the lower level of the tray holding portion in the normal operation and returns to the origin as shown in FIG. 10(*c*). Then, after moving in the X-axis direction to position above the tray set elevator 307, the tray transfer arm 205 moves downward in the Z-axis direction in the torque restriction operation as shown in FIG. 10(*d*).

As shown in FIG. 10(*e*), when the customer tray KST held by the tray transfer arm 205 contacts the tray set elevator 307, a torque is applied to the Z-axis drive, the moving operation of the tray transfer arm 205 stops based on the torque application, the tab member 22 rotates in the opening direction, and the tab 221*b* of the tab member 22*b* releases the customer tray KST.

In this way, after loading the customer tray KST on the tray set elevator 307, the tray transfer arm 205 moves upward in the Z-axis direction in a state of holding only the cover tray CT at the upper level of the tray holding portion in the normal operation and returns to the origin.

On the other hand, an operation of the tray transfer arm 205 when conveying customer tray KST loaded with post-test IC devices from the tray set elevator 407 to the post-test IC stocker 202 in the above handler 1 will be explained with reference to FIG. 11.

Figure 11:
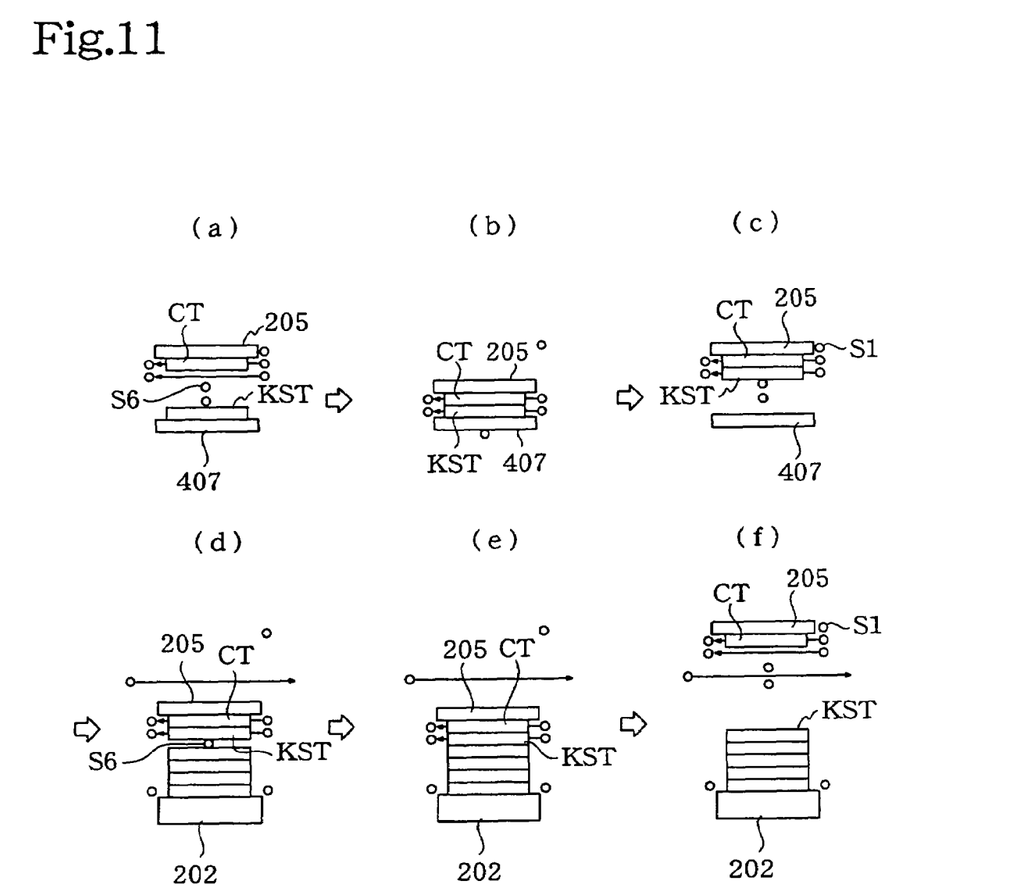
FIG. 11 shows explanatory views of steps that the tray transfer arm conveys customer trays from the tray set elevator to a post-test IC stocker.

As shown in FIG. 11(*a*), the tray transfer arm 205 holding the cover tray CT moves downward in the Z-axis direction in the torque restriction operation after moving in the X-axis direction to position above the tray set elevator 407.

As shown in FIG. 11(*b*), when the cover tray CT held by the tray transfer arm 205 contacts the customer tray KST on the tray set elevator 407, a torque is applied to the Z-axis drive, the moving operation of the tray transfer arm 205 suspends based on the torque application, the tab member 22 rotates in the closing direction, and the tab 221*b* of the tab 22*b* engages with the rim of the customer tray KST to hold the customer tray KST.

As shown in FIG. 11(*c*), the tray transfer arm 205 moves upward in the Z-axis direction in a state of holding the customer tray KST at the lower level of the tray holding portion in the normal operation and returns to the origin.

The tray transfer arm 205 holding the customer tray KST moves downward in the Z-axis direction in the normal operation after moving in the X-axis direction to position above a prescribed post-test IC stocker 202. As shown in FIG. 11(*d*), the distance confirmation sensor S6 moves downward to a position of the cover tray CT as the tray transfer arm 205 moves and, when the distance confirmation sensor S6 senses an existence of the uppermost customer tray KST loaded on the post-test IC stocker 202, the moving operation of the tray transfer arm 205 is switched to the torque restriction operation.

The tray transfer arm 205 moves downward in the Z-axis direction in the torque restriction operation and, as shown in FIG. 11(*e*), when the customer tray KST held by the tray transfer arm 205 contacts the uppermost customer tray KST loaded on the post-test IC stocker 202, a torque is applied to the Z-axis drive, the moving operation of the tray transfer arm 205 stops based on the torque application, the tab member 22 rotates in the opening direction and the tab 221*b* of the tab member 22*b* releases the customer tray KST.

As shown in FIG. 11(*f*), the tray transfer arm 205 moves upward in the Z-axis direction in a state of holding only the cover tray CT at the upper level of the tray holding portion and returns to the origin after loading the customer tray KST to the post-test IC stocker 202.

In the handler 1 having the configuration that the tray transfer arm 205 is movable in the Z-axis direction as explained above and a distance configuration sensor S6 is provided to the tray transfer arm 205, it is not necessary to provide an elevator to each of the stockers 201 and 202 and it is not necessary to manually input the loaded number, to provide a sensor to each of the stockers 201 and 202 and to provide a movable sensor to a prescribed stocker 201 and 202 to perceive the loading number (a height) of the customer trays KST on each of the stockers 201 and 202. Therefore, it is possible to hold and convey the customer trays KST in a short operation time with a simple configuration.

Also, in the handler 1, wherein a moving operation of the tray transfer arm 205 is switched from a normal operation to a torque restriction operation by sensing by the distance confirmation sensor S6 and the moving operation of the tray transfer arm 205 stops due to an application of a torque to the Z-axis drive, a moving speed of the tray transfer arm 205 at a position not requiring torque restriction can be maintained high, and it is possible to prevent the tray transfer arm 205 from not reaching to the customer tray KST or colliding with the customer tray KST to damage one or both of them even if the distance confirmation sensor S6 is not a highly accurate sensor (if it is not possible to accurately perceive a position of the customer tray KST or the loading portion).

Furthermore, according to the tray transfer arm 205 for holding or releasing a customer tray KST in a state of applying a torque to the Z-axis drive, that is, in a state of pressing the tray transfer arm 205 against the customer tray KST or pressing the customer tray KST against the loading portion, the customer tray KST can be held and released stably comparing with the case of determining a height of the customer tray KST or a loaded height of the customer trays KST and moving the tray transfer arm 205 to the height to hold or release the customer tray KST.

The embodiments explained above are described to facilitate understanding of the present invention and is not to limit the present invention. Accordingly, respective elements disclosed in the above embodiments include all design modifications and equivalents belonging to the technical scope of the present invention.

For example, in the above handler 1, the device for holding and conveying the test tray TST and the device for picking up and conveying IC devices may be configured as same as the tray transfer arm 205 explained above. Also, a CCD or an end-measuring machine may be used instead of the distance confirmation sensor S6.

INDUSTRIAL APPLICABILITY

As explained above, according to the conveyor, electronic device handling apparatus and conveying method of the present invention, it is possible to surely hold and convey a prescribed object with a simple configuration in a short operation time and it is not necessary to accurately perceive a height of the object or a loaded height of the objects. Namely, the present invention is useful for conducting a test on an electronic device efficiently and smoothly with a low cost.

The invention claimed is:

1. A conveyor device capable of holding a prescribed object and moving at least in a Z-axis direction in an electronic device handling apparatus, comprising:
   a holding device holding and releasing the prescribed object; and
   a Z-axis drive moving said holding device in the Z-axis direction and switching the moving operation in the Z-axis from a normal operation to a torque restriction operation while moving said holding device downward in the Z-axis direction.

2. The conveyor device as set forth in claim 1, wherein said Z-axis drive switches from a normal operation to a torque restriction operation when a distance between said holding device and an object to be held or a loading portion of the object becomes a predetermined distance.

3. The conveyor device as set forth in claim 2, furthermore comprising a sensor sensing that a distance between said holding device and an object to be held or a loading portion of the object is a predetermined distance.

4. The conveyor device as set forth in claim 1, wherein, when a predetermined torque is applied to said Z-axis drive, said Z-axis drive stops moving of said holding device and said holding device releases the prescribed object.

5. The conveyor device as set forth in claim 4, wherein, as a result that said holding device contacts an object to be held or that the object held by said holding device contacts a loading portion of the object, said torque is applied to said Z-axis drive.

6. The conveyor device as set forth in claim 1, wherein said holding device is a device which can hold and release a tray capable of being loaded with a plurality of electronic devices.

7. The conveyor device as set forth in claim 6, wherein said holding device comprises a tab member engaging with said tray, said tab member is movable around the Z-axis, and said tray can be held or released by rotating said tab member around the Z-axis.

8. The conveyor device as set forth in claim 1, wherein said holding device holds one or both of a first tray capable of being loaded with a plurality of electronic devices and a second tray for covering the electronic devices loaded on said first tray and moves.

9. The conveyor device as set forth in claim 8, wherein said holding device comprises a holding/releasing mechanism capable of holding or releasing said tray and holding the trays in a state of two levels at a plurality of positions at the edge of the tray.

10. An electronic device handling apparatus handling an electronic device to be tested to conduct a test on the electronic device, comprising the conveying device as set forth in any one of claims 1 to 9.

11. A conveying method for conveying a prescribed object in an electronic device handling apparatus comprising a holding device holding and releasing the object and a Z-axis drive moving said holding device in the Z-axis direction, comprising steps of:
    moving said holding device downward in the Z-axis direction by said Z-axis drive in a normal operation;
    sensing that a distance of said holding device and an object to be held or a loading portion of the object is a predetermined distance; and
    switching an operation of said Z-axis drive in the Z-axis direction from the normal operation to a torque restriction operation based on said sensing.

12. A conveying method in the electronic device handling apparatus as set forth in claim 1, comprising steps of:
    sensing that a torque is applied to said Z-axis drive as a result that said holding device contacts an object to be held or that the object held by said holding device contacts a loading portion of the object; and
    stopping the operation of said Z-axis drive and making said holding device perform an object holding operation or an object releasing operation based on said sensing.

13. An electronic device handling apparatus for an integrated circuit (IC) device testing apparatus, the IC device testing apparatus includes a handler for conveying IC devices to be tested to a test head, the handler including an IC storing section for storing the IC devices which are held in a customer tray, loading and unloading sections for conveying the IC devices between the IC storing section and a chamber, the loading and unloading sections including a tray set elevator for lifting the customer tray to a window, the electronic device handling apparatus comprising:
    a tray transfer arm movable in a Z-axis direction to transfer and receive the customer tray to and from the tray set elevator of the loading and unloading sections, and movable in X-axis direction to transfer and receive the customer tray to and from the tray set elevator and the IC storing section; and a Z-axis drive moving the tray transfer arm in the Z-axis direction and switch the moving operation in the Z-axis direction from a normal operation to a torque restriction operation while moving the tray transfer arm downward in the Z-axis direction.

14. The electronic device handling apparatus of claim 13, wherein the tray transfer arm further comprises a tab member configured to engage with the customer tray, wherein the tab member is also configured to be movable around the Z-axis to release or hold the customer tray.

15. The electronic device handling apparatus of claim 13, further comprising an upper limit sensor for sensing when the IC storing section includes more than a predetermined number of customer trays, wherein the upper limit sensor is coupled to the Z-axis drive, wherein the Z-axis drive locks downward movement of the tray transfer arm when the upper limit sensor senses that the IC storing section includes more than the predetermined number of customer trays.

16. An electronic device handling apparatus for an integrated circuit (IC) device testing apparatus, the IC device testing apparatus includes a handler for conveying IC devices to be tested to a test head, the handler including an IC storing section for storing the IC devices which are held in a customer tray, loading and unloading sections for conveying the IC devices between the IC storing section and a chamber, the loading and unloading sections including a tray set elevator for lifting the customer tray to a window, the electronic device handling apparatus comprising:

a tray transfer arm movable in a Z-axis direction to transfer and receive the customer tray to and from the tray set elevator of the loading and unloading sections, and movable in X-axis direction to transfer and receive the customer tray to and from the tray set elevator and the IC storing section;

a Z-axis drive configured to move the tray transfer arm in the Z-axis direction and switch the moving operation from a normal operation to a torque restriction operation while moving the tray transfer arm downward in the Z-axis direction; and a distance confirmation sensor for sensing when an object is at a predetermined position below the customer tray, wherein the distance confirmation sensor is coupled to the Z-axis drive, wherein the Z-axis drive switches the moving operation from the normal operation to the torque restriction operation when the distance confirmation sensor senses that the object is at the predetermined position below the customer tray.

17. The conveyor device as set forth in claim 1, further comprising a distance confirmation sensor for sensing when the prescribed object is at a predetermined position below a loading portion, wherein the distance confirmation sensor is coupled to the Z-axis drive, wherein the Z-axis drive switches the moving operation from the normal operation to the torque restriction operation when the distance confirmation sensor senses that the object is at the predetermined position below the loading portion.

18. The conveyor device as set forth in claim 1, wherein the Z-axis drive comprises an electronically controllable servo-motor for switching the moving operation from the normal operation to the torque restriction operation while moving said holding device downward in the Z-axis direction.

19. The conveyor device as set forth in claim 13, wherein the Z-axis drive comprises an electronically controllable servo-motor for switching the moving operation from the normal operation to the torque restriction operation while moving said tray transfer arm downward in the Z-axis direction.

20. The conveyor device as set forth in claim 1, wherein, when a predetermined torque is applied to said Z-axis drive, said Z-axis drive stops moving of said holding device and said holding device releases the prescribed object.

* * * * *